(12) United States Patent
Ho et al.

(10) Patent No.: US 7,616,479 B2
(45) Date of Patent: Nov. 10, 2009

(54) DATA WRITING METHOD FOR FLASH MEMORIES

(75) Inventors: Chih-Hao Ho, Hsinchu (TW); Cheng-Ming Yih, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 252 days.

(21) Appl. No.: 11/839,255

(22) Filed: Aug. 15, 2007

(65) Prior Publication Data
US 2009/0046516 A1    Feb. 19, 2009

(51) Int. Cl.
G11C 16/04    (2006.01)
(52) U.S. Cl. .............................. 365/185.02; 365/185.18

(58) Field of Classification Search ............ 365/185.02, 365/185.18, 185.25, 185.33
See application file for complete search history.

(56) References Cited

U.S. PATENT DOCUMENTS 6,480,422 B1 *   11/2002   Wong ..................... 365/185.28
2008/0080246 A1 *   4/2008   Kim ....................... 365/185.17

* cited by examiner

Primary Examiner—Vu A Le
(74) Attorney, Agent, or Firm—J.C. Patents

(57) ABSTRACT

A data writing method for flash memories suitable for a flash memory using a switching unit to control a bit line thereof is disclosed. The data writing method for flash memories includes applying a square wave signal to a word line of the flash memory and applying a descent wave signal to the switching unit for the bit line of the flash memory to receive a fixed drain voltage.

10 Claims, 3 Drawing Sheets

DATA WRITING METHOD FOR FLASH MEMORIES

BACKGROUND OF THE INVENTION

1. Field of Invention

The present invention relates to a data writing method for non-volatile memories, and more particularly to a data writing method for flash memories.

2. Description of the Related Art

Having the characteristics of non-volatility, high-density, fast response speed and so on, flash memories have become more and more popular among the memories. For a memory, the reliability of the memory elements is closely related to the saving of memorized data. Therefore, in recent years, various data writing methods for flash memories have been provided for advancing the reliability of flash memories.

FIG. 1 is a diagram showing a conventional data writing method for flash memories, where a square wave signal $V_{BLT1}$ and a square wave signal $V_{WL1}$ are respectively applied to a switching unit 110 and a word line WL1 for writing data purpose. The switching unit 110 is formed by an N-type transistor MN1. Considering the equivalent impedance of the N-type transistor MN1 as a resistor $R_1$, the drain voltage $V_{D1}$ via a bit line BL1 provided by the switching unit 110 can be expressed by an equation of $$V_{D1} = V_{DD} - I_{D1} * R_1 \quad (1)$$

where $V_{DD}$ is the operation voltage of the switching unit 110 and $I_{D1}$ is the drain current via the bit line BL1.

FIG. 2 is a timing graphic relating the method in FIG. 1. Referring to FIG. 2, with the increase of the writing time, the threshold voltage of a flash memory cell 101 would rise, and the drain current $I_{D1}$ via the bit line BL1 is gradually decreased. According to the equation (1), the declined drain current $I_{D1}$ would boost the drain voltage $V_{D1}$. Therefore, at the point, all the flash memory cells 101~104 connected to the same bit line BL1 would spark a drain disturbance due to the bias on the common bit line BL1 (a continuously increased drain voltage $V_{D1}$), which further affects the reliability of the flash memory 120.

To avoid the drain disturbance, another conventional data writing method for flash memories is provided, as shown in FIG. 3. Wherein, a square wave signal $V_{BLT3}$ is applied to the switching unit 110, and an ascent wave signal $V_{WL3}$ is applied to a word line WL1. The drain current $I_{D3}$ passing through the bit line BL1 would be not to decline with the varied threshold voltage $V_{Th}$ of the flash memory cell 130 because the voltage levels of the ascent wave signal $V_{WL3}$ are increased with the writing time. Such an unvaried drain current $I_{D3}$ with the writing time would generate a stable drain voltage $V_{D3}$, which contributes to reduce the influence of the drain disturbance. FIG. 4 is a timing graphic relating the method in FIG. 3, where the relationships between the drain current $I_{D3}$/drain voltage $V_{D3}$ and the writing time are illustrated. Although the conventional data writing method for a flash memory as shown in FIG. 3 is able to reduce the influence of a drain disturbance on the flash memory 120, however, a flash memory cell 105 together with the flash memory cell 101 connected to a same word line WL1 would spark a gate disturbance due to the bias on the common word line WL1 (a continuously increased signal), which also affects the reliability of the flash memory 120.

It can be seen from the above that by using the conventional data writing method for a flash memory, a so-called gate disturbance or a drain disturbance would be generated with other flash memory cells which are connected to the same word line or the same bit line as a flash memory cell is in writing operation since a same bias is applied to both the other flash memory cells and the flash memory cell in writing operation. In other words, by using the conventional data writing method for flash memories, the reliability of a flash memory would decay with the increased number of writing operations due to a gate disturbance or a drain disturbance, which further affects the correctness of data saving, or even results in damaging the flash memory.

SUMMARY OF THE INVENTION

Based on the above described, the objective of the present invention is to provide a data writing method for flash memories, where by means of a bias applied to a flash memory generated by a descent wave signal and a square wave signal, data to be saved is written. By using the data writing method, gate disturbance and drain disturbance are avoided, and the reliability of a flash memory is effectively advanced.

To achieve the above or other objectives, the present invention provides a data writing method for flash memories, which is suitable for a flash memory with a bit line controlled by a switching unit. The data writing method for flash memories includes applying a descent wave signal to a switching unit to make the bit line of the flash memory receive a stable drain voltage, wherein, the voltage levels of the descent wave signal are decreased with the writing time. The data writing method for flash memories further includes applying a square wave signal to the word line of the flash memory during the duty duration of the descent wave signal. In this way, under a bias generated by the descent wave signal and the square wave signal, data to be saved is written into the flash memory.

In an embodiment, wherein the voltage levels of the square wave signals which are applied to the word line during the duty duration of each signal are the same, the equivalent resistor of the switching unit is increased with the writing time, and the drain voltage is not varied with the writing time.

In an embodiment, the above-described data writing method for flash memories is suitable for a flash memory with an NOR-type array structure.

In the above-described data writing method for flash memories of an embodiment, the switching unit is connected in series between a bit line of the flash memory and the operation voltage to control the drain voltage according to the descent wave signal.

Since the present invention uses a descent wave signal to generate a stable drain voltage and uses a wave signal, which are applied to the word line during the duty duration of each signals, thus, during the course of writing a data into the flash memory, the method is able to eliminate drain disturbance and gate disturbance, which assures the correctness of the data saving and advances the reliability of the flash memory.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 5:
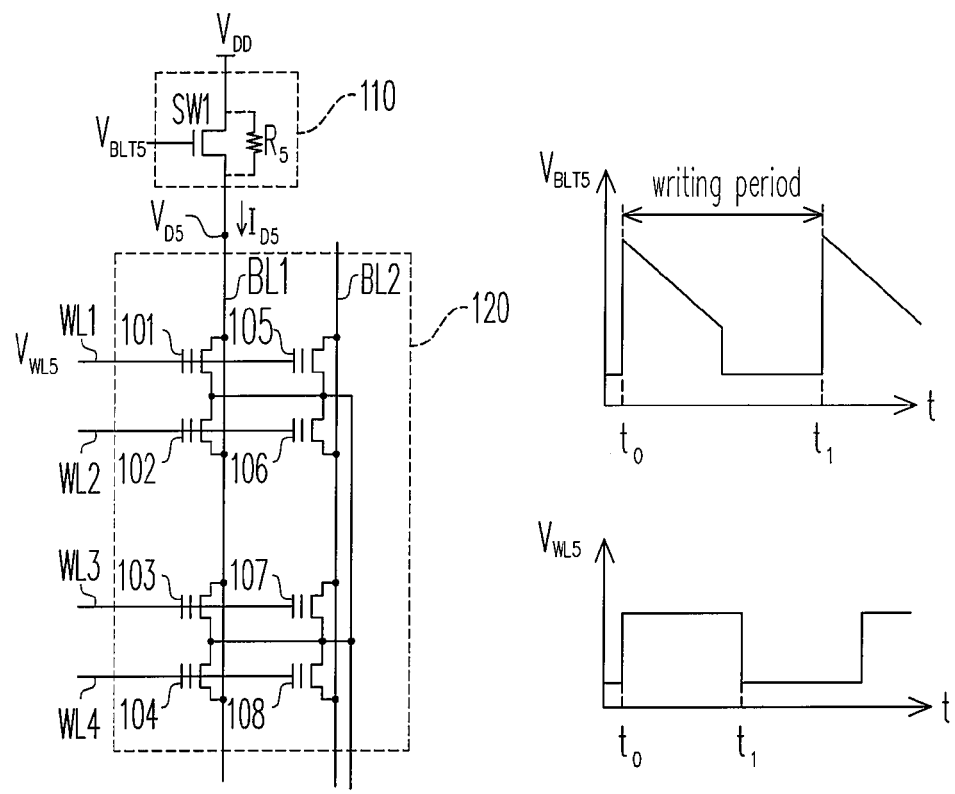
FIG. 5 is a diagram showing the data writing method for flash memories according to an embodiment of the present invention.

FIG. 5 is a diagram showing the data writing method for flash memories according to an embodiment of the present invention. For depiction convenience, a switching unit 110 and a flash memory 120 are shown in FIG. 5. The flash memory 120 includes eight flash memory cells 101~108, two bit lines BL1~BL2 and four word lines WL1~WL4. The switching unit 110 is connected between the bit line BL1 of the flash memory 120 and an operation voltage $V_{DD}$ for deciding whether to output a drain voltage $V_{D5}$ according to a descent wave signal $V_{BLT5}$.

Continuing to FIG. 5, for simplicity, it is assumed that a data to be saved is written into the flash memory cell 101 defined by the bit line BL1 and the word line WL1. To perform a writing operation on the flash memory cell 101, a descent wave signal $V_{BLT5}$ is applied to the switching unit 110, thus the bit line BL1 of the flash memory 120 receives the drain voltage $V_{D5}$. Wherein, the voltage levels of the descent wave signal $V_{BLT5}$ are decreased with the writing time. In addition, a square wave signal is applied to the word line WL1 of the flash memory 120 during the duty duration of each signals of the descent wave signal $V_{BLT5}$.

Figure 1:
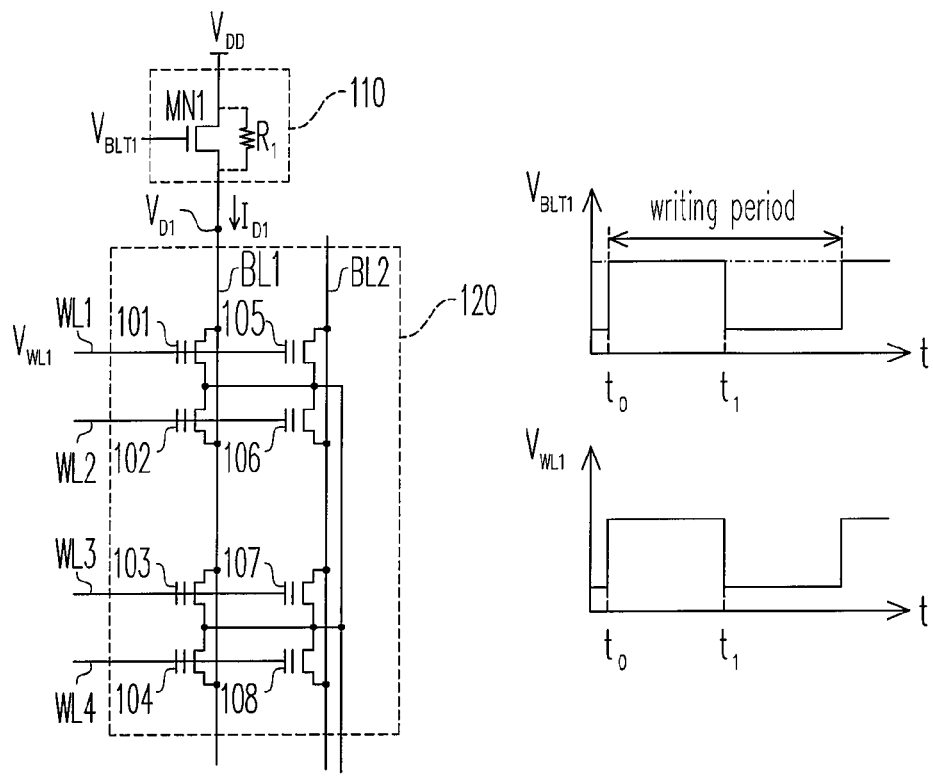
FIG. 1 is a diagram showing a conventional data writing method for flash memories.
Figure 2:
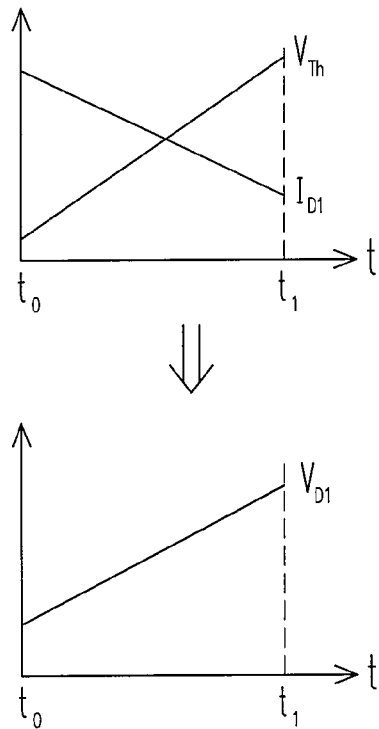
FIG. 2 is a timing graphic relating to the method in FIG. 1.
Figure 6:
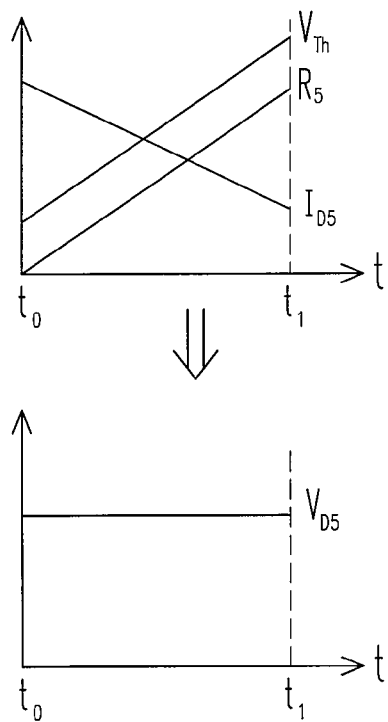
FIG. 6 is a timing graphic relating to the method in FIG. 5.

During the writing course of the flash memory cell 101, assuming the equivalent impedance of the switching unit 110 is a resistor $R_5$, the drain voltage $V_{D5}$ can be expressed by an equation of $$V_{D5}=V_{DD}-I_{D5}*R_5 \qquad (2)$$

where $V_{DD}$ is the operation voltage of the switching unit 110 and $I_{D5}$ is the drain current via the bit line BL1. Referring to FIG. 6, as a writing operation is performed on the flash memory cell 101 according to a bias generated by the descent wave signal $V_{BLT5}$ and the square wave signal $V_{WL5}$, the threshold voltage $V_{Th}$ of the flash memory cell 101 would be increased with the writing time, which makes a drain current $I_{D5}$ passing through the bit line BL1 decline with the writing time. To avoid a drain disturbance caused by, for example, the conventional data writing method for flash memories in FIG. 1, the descent wave signal $V_{BLT5}$ are decreased with the writing time in the embodiment, which makes the equivalent impedance of the switching unit 110 (the resistor $R_5$) decline with the writing time. Furthermore, if the product of the drain current $I_{D5}$ and the resistor $R_5$, ($I_{D5}*R_5$), remains a constant or a minimum by design, the switching unit 110 would generate a drain voltage $I_{D5}$, which is unvaried or which variation is small than 0.5 volt with the writing time according to the equation (2). In this way, during performing a writing operation on the flash memory cell 101, the flash memory cells 102~104 connected to the same bit line BL1 of the flash memory cell 101 would not result in the problem that the charges feed through the floating gate because of enduring the bias as same as the flash memory cell 101 does. In short, the reliability of the flash memory 120 is advanced by eliminating the drain disturbance.

Figure 3:
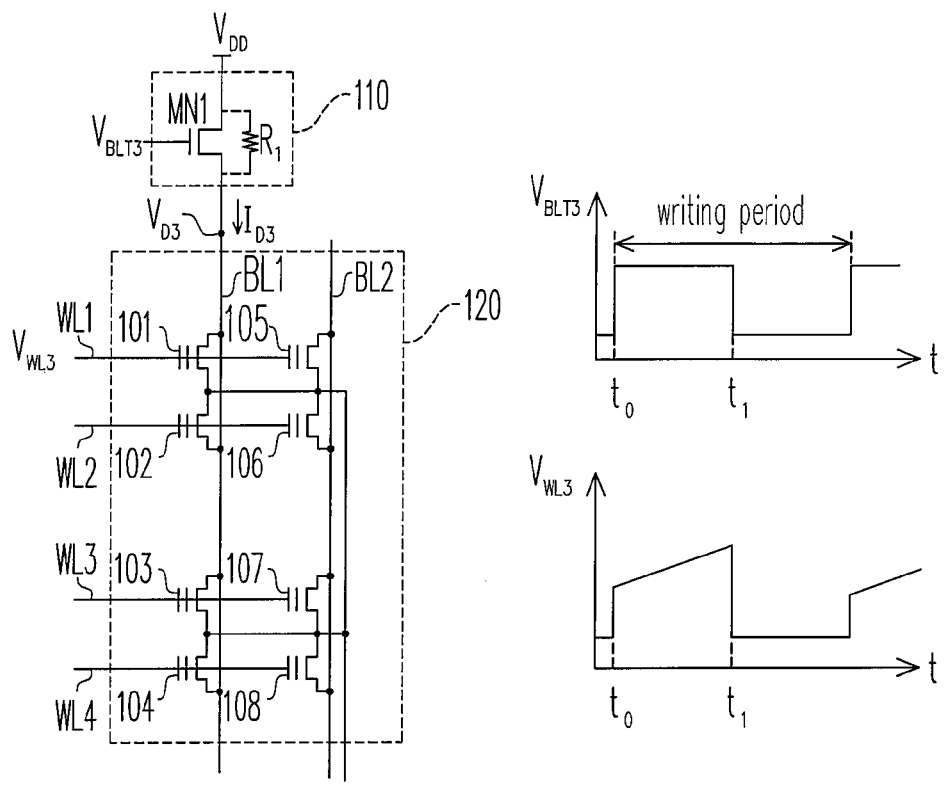
FIG. 3 is another diagram showing a conventional data writing method for flash memories.
Figure 4:
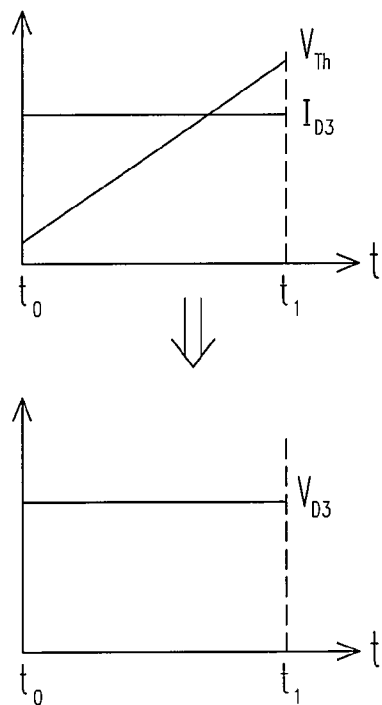
FIG. 4 is a timing graphic relating to the method in FIG. 3.

In an embodiment of the present invention, the voltage levels of the square wave signals keep unchanged over each duty durations of the descent wave signal $V_{BLT5}$. In comparison with the conventional data writing method for flash memories in FIG. 3, however, the square wave signal $V_{WL5}$ (a continuously increased signal) applied to the word line WL1 would not result in a gate disturbance which supposedly occurs by the prior art since the flash memory cell 105 is connected to the same word line WL1 of the flash memory cell 101 and the same bias of the flash memory cell 101 (the square wave signal $V_{WL5}$) is applied to the flash memory cell 105 as well. Therefore, the reliability of the flash memory 120 is further advanced due to the reduction of the gate disturbance.

The embodiment of the present invention is also suitable for a flash memory with an NOR-array structure. The switching unit 110 herein includes a switch SW1, wherein the first terminal thereof is coupled with the operation voltage $V_{DD}$, while the second terminal thereof is coupled with the bit line BL1 of the flash memory. The switch determines the on/off status between the first terminal and the second terminal thereof according to the descent wave signal $V_{BLT5}$. The above-described switch SW1 is formed by, but not limited to, an N-type transistor, and anyone skilled in the art is able to use other components rather than the N-type transistor to form the switch.

Note that although the above-described embodiment has given a feasible architecture of the switching unit 110, however, for anyone skilled in the art, it is well known that various manufacturers have different implementations of the switching unit 110, which are not limited by the present invention. In fact, once a switching unit 110 for controlling the bit line BL1 of a flash memory 120 is used, it is treated as without departing from the scope or spirit of the invention.

In summary, in the embodiment of the present invention the stable drain voltage generated by a descent wave signal and the square wave signals which are applied during the duty duration of the descent wave signal are employed so that the other standby flash memory cells (for example, the flash memory cells 102~105) located on a same word line or a same bit line of the running flash memory cell (for example, the flash memory cell 101) do not generate so-called gate disturbance or drain disturbance. Therefore, the present invention largely advances the reliability of the flash memory and assures the correctness of the saved data.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A data writing method for flash memories, suitable for a flash memory, wherein a bit line thereof is controlled by a switching unit; the method comprising:
    applying a descent wave signal to the switching unit for the bit line of the flash memory to receive a drain voltage, wherein the voltage levels of the descent wave signal are decreased with the writing time; and
    applying a word line signal to a word line of the flash memory during the duty duration of the descent wave signal.

2. The data writing method for flash memories as recited in claim 1, wherein the flash memory is a flash memory with an NOR-array structure.

3. The data writing method for flash memories as recited in claim 1, wherein the equivalent impedance of the switching unit is increased with the writing time.

4. The data writing method for flash memories as recited in claim 1, wherein the variation of the drain voltage is small than 0.5 volt with the writing time.

5. The data writing method for flash memories as recited in claim 1, wherein the drain voltage is unvaried with the writing time.

6. The data writing method for flash memories as recited in claim 1, wherein the switching unit is connected in series between the bit line of the flash memory and an operation voltage and is used for deciding whether to output the drain voltage according to the descent wave signal.

7. The data writing method for flash memories as recited in claim 6, wherein the switching unit comprises:

a switch, wherein the first terminal thereof is coupled with the operation voltage, the second terminal thereof is coupled with the bit line of the flash memory and the switch is used for determining the on/off status between the first terminal and the second terminal thereof according to the descent wave signal.

8. The data writing method for flash memories as recited in claim 7, wherein the switch is formed by an N-type transistor.

9. The data writing method for flash memories as recited in claim 1, wherein the descent wave signal is square wave signal.

10. The data writing method for flash memories as recited in claim 1, wherein the word line signal is square wave signal.

* * * * *